US012628704B2

(12) United States Patent
Lin et al.

(10) Patent No.: US 12,628,704 B2
(45) Date of Patent: May 12, 2026

(54) OPTOELECTRONIC PACKAGE STRUCTURE AND METHOD OF MANUFACTURING THE SAME

(71) Applicant: Advanced Semiconductor Engineering, Inc., Kaohsiung (TW)

(72) Inventors: Jr-Wei Lin, Kaohsiung (TW); Mei-Ju Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 33 days.

(21) Appl. No.: 18/603,181

(22) Filed: Mar. 12, 2024

(65) Prior Publication Data

US 2024/0250080 A1 Jul. 25, 2024

Related U.S. Application Data

(63) Continuation of application No. 17/506,462, filed on Oct. 20, 2021, now Pat. No. 11,929,357.

(51) Int. Cl.
*H01L 23/544* (2006.01)
*H01L 23/00* (2006.01)
(Continued)

(52) U.S. Cl.
CPC ........ *H01L 25/167* (2013.01); *H01L 23/5386* (2013.01); *H01L 24/16* (2013.01); *H01L 2224/16227* (2013.01)

(58) Field of Classification Search
CPC .................. H05K 3/4602; H05K 1/185; H05K 2201/10045; H01L 23/49822; H01L 23/49838; H01L 23/5386; H01L 23/4985; H01L 23/49861; H01L 23/538–5389; H01L 23/5383; H01L 23/49833; H01L 23/5385; H01L 23/14; H01L 23/5387; H01L 23/5384; H01L 23/49827; H01L 23/49811–49816; H01L 23/49805; H01L 25/167; H01L 25/00; H01L 24/16; H01L 2224/16227; H01L 31/00; H01L 33/48; H01L 27/00; H01L 2224/48225–4824; H01L 2224/48155–48165; H01L 2224/40225–4024;
(Continued)

(56) References Cited

U.S. PATENT DOCUMENTS 10,025,047 B1 7/2018 Liu et al.
11,177,219 B1 11/2021 Youn et al.
(Continued)

OTHER PUBLICATIONS

Non-Final Office Action for U.S. Appl. No. 17/506,462, issued Mar. 29, 2023, 9 pages.
(Continued)

*Primary Examiner* — Lawrence C Tynes, Jr.
(74) *Attorney, Agent, or Firm* — FOLEY & LARDNER LLP

(57) ABSTRACT

An optoelectronic package structure is provided. The optoelectronic package includes a carrier, an electronic component, a photonic component and a first power supply path in the carrier. The carrier includes a first region and the electronic component is disposed over the first region of the carrier. A first power supply path is electrically connects the electronic component.

4 Claims, 9 Drawing Sheets

(51) Int. Cl.

| | | |
|---|---|---|
| *H01L 23/538* | (2006.01) |
| *H01L 25/065* | (2023.01) |
| *H01L 25/16* | (2023.01) |

(58) Field of Classification Search

CPC ..................... H01L 2224/40155–40165; H01L
2224/32225–3224; H01L
2224/32155–32168; H01L
2224/24225–24227; H01L 2224/24155;
H01L 2224/16225–1624; H01L
2224/16155–16168; F21Y 2115/00–30;
H05B 45/00; H05B 47/00; G09G 3/00;
F21V 23/00

See application file for complete search history.

(56)  References Cited

U.S. PATENT DOCUMENTS

| | | | |
|---|---|---|---|
| 2013/0230272 A1 | 9/2013 | Raj et al. | |
| 2014/0321804 A1* | 10/2014 | Thacker | ............. H01L 25/0655<br>385/14 |
| 2015/0358084 A1* | 12/2015 | Lesea | .................. H04B 10/503<br>398/189 |
| 2022/0246772 A1* | 8/2022 | Wilcoxon | ............... H10F 77/50 |
| 2023/0080454 A1 | 3/2023 | Pietambaram et al. | |

OTHER PUBLICATIONS

Notice of Allowance for U.S. Appl. No. 17/506,462, issued Nov. 6, 2023, 10 pages.

* cited by examiner

OPTOELECTRONIC PACKAGE STRUCTURE AND METHOD OF MANUFACTURING THE SAME

CROSS-REFERENCE TO RELATED APPLICATION

This application is a continuation of U.S. patent application Ser. No. 17/506,462, filed Oct. 20, 2021, now U.S. Pat. No. 11,929,357, the content of which is incorporated herein by reference in its entirety.

BACKGROUND

1. Technical Field

The present disclosure relates generally to optoelectronic package structures and methods of manufacturing the optoelectronic package structures.

2. Description of the Related Art

Currently, an optoelectronic package may include an application specific integrated circuit (ASIC) and an optoelectronic device arranged in a vertical direction. The optoelectronic device may include an electronic integrated circuit (EIC) and a photonic integrated circuit (PIC). A carrier, such as a substrate or an interposer, may be disposed between the ASIC and the optoelectronic component. However, given that the optoelectronic component and the ASIC are arranged in a vertical direction and a relatively thick carrier is used, electrical connection issues may exist due to the relatively long electrical path between the ASIC and the optoelectronic device.

SUMMARY

In some arrangements, an optoelectronic package structure includes a carrier, an electronic component, a photonic component and a first power supply path in the carrier. The carrier includes a first region and the electronic component is disposed over the first region of the carrier. A first power supply path electrically connects the electronic component.

In some arrangements, an optoelectronic package structure includes a carrier, an electronic component and a photonic component. The carrier includes a first region and a second region. The electronic component is at least partially embedded in the second region of the carrier. The photonic component is disposed over the electronic component.

In some arrangements, an optoelectronic package structure includes a processing unit, an electronic component and a carrier. The carrier includes a first path configured to supply power to the processing unit and a second path configured to electrically communicate the processing unit and the electronic component. The second path is shorter than the first path.

BRIEF DESCRIPTION OF THE DRAWINGS

Aspects of some arrangements of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Figure 1:
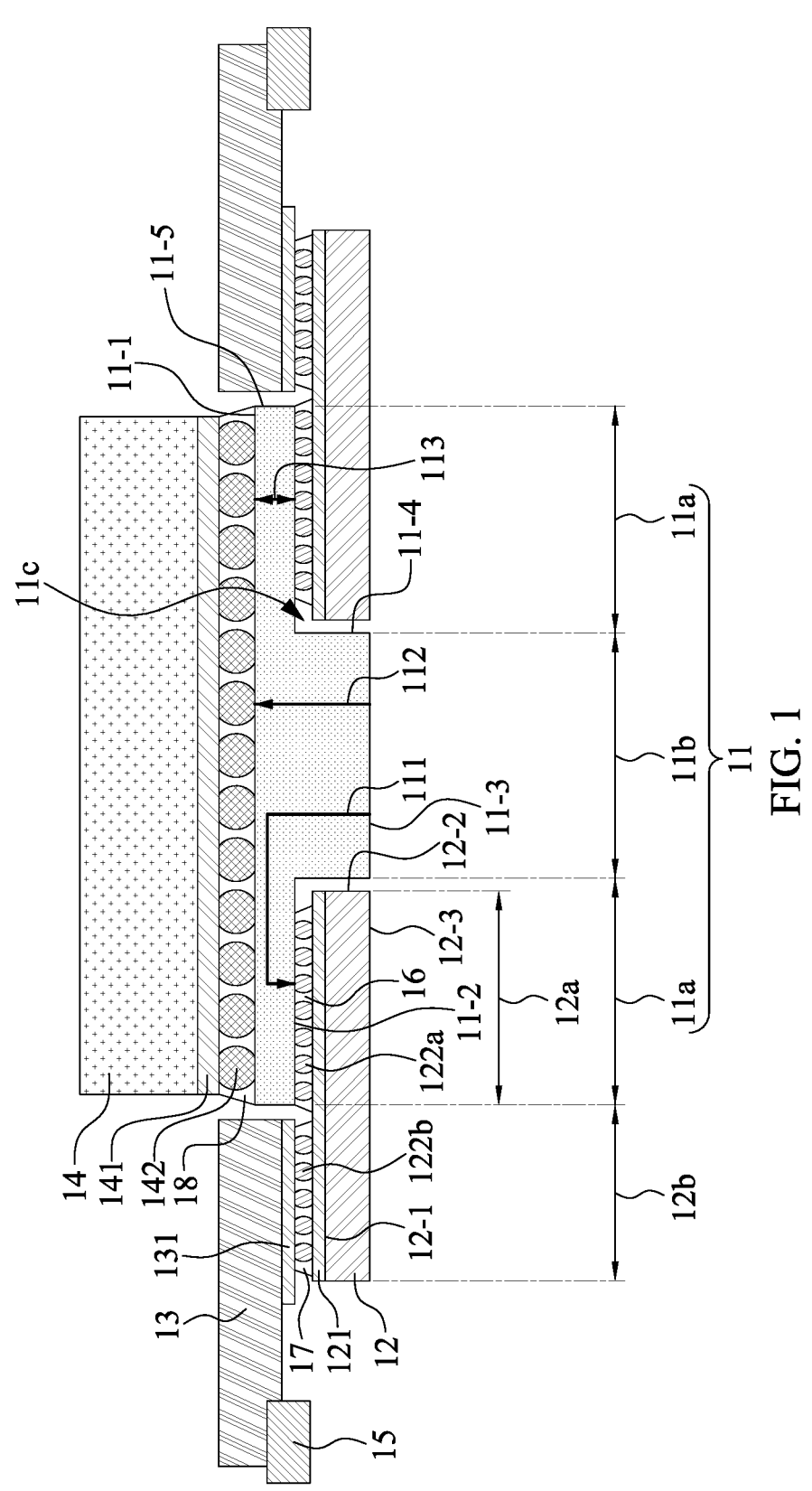
FIG. 1 illustrates a schematic cross-sectional view of optoelectronic package structure in accordance with some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

As used herein, the "active side" or "active surface" of a photonic component may refer to a side or a surface along which a waveguide is disposed. The waveguide may be disposed adjacent to the active side or the active surface. The "inactive side" or "inactive surface" of a photonic component may refer to a side or a surface along which no waveguide is disposed.

As used herein, the term "active side" or "active surface" of an electronic component may refer to a side or a surface of an electronic component on which electrical or contact terminals such as contact pads, conductive studs or conductive pillars are disposed, for transmission of electrical signals or power. The "inactive side" or "inactive surface" of an electronic component may refer to a surface of the electronic component on which no contact terminals are disposed.

Referring to FIG. 1, FIG. 1 illustrates a schematic cross-sectional view of an optoelectronic package structure 1 in accordance with some arrangements of the present disclosure. The optoelectronic package structure 1 includes a carrier 11, at least one electronic components 12, at least one photonic components 13, a processing unit 14, and at least one optical component 15. In some arrangements, the optoelectronic package structure 1 may further include redistribution layer (RDL) 121 disposed on, adjacent to, and/or contacting the electronic component 12, RDL 131 disposed under, adjacent to, and/or contacting the photonic component 13, and RDL 141 disposed under, adjacent to, and/or contacting the processing unit 14. In some arrangements, the RDLs 121, 131, and 141 may each include under-bump metal (UBM) (not shown). In some arrangements, the optoelectronic package structure 1 may further include conductive elements 122a, 122b, and 142 and underfills 16, 17, and 18. In some arrangements, the optoelectronic package 1 may further includes an encapsulant (not shown) encapsulating the processing unit 14.

As shown in FIG. 1, the carrier 11 includes a first region 11a and a second region 11b. In some arrangements, the first region 11a is a peripheral region of the carrier 11, the second region 11b is a central region of the carrier 11. In some arrangements, the second region 11b may be surrounded by the first region 11a. In some arrangements, the second region 11b may be between two portions of the first region 11a from the cross-sectional view of FIG. 1. As shown in FIG. 1, the carrier 11 may include a first power supply path 111, a second power supply path 112, and an electrical signal path 113. In some arrangements, the power supply paths 111 and 112 and the electrical signal path 113 may be without or with through vias. In some arrangements, the first power supply path 111 is included in or traverse through the first region 11a and the second region 11b of the carrier. The first power supply path 111 may pass through the first region 11a and the second region 11b of the carrier 11 to provide electrical communication (e.g., to transmit electrical signals) between the second surface 11-2 and the third surface 11-3 of the carrier 11. The first power supply path 111 may be configured to supply power (e.g., from a power source (not shown) connected to the first power supply path 111 at the surface 11-3) to the electronic component 12. In some arrangements, the second power supply path 112 is included in or traverse through the second region 11b of the carrier 11. In some arrangements, the second power supply path 112 may pass through the second region 11b of the carrier 11 to provide electrical communication (e.g., to transmit electrical signals) between the first surface 11-1 and the third surface 11-3 of the carrier 11. The second power supply path 112 may be configured to supply power (e.g., from a power source (not shown) connected to the second power supply path 112 at the surface 11-3) to the processing unit 14. The power source may be an external power source which provides power to the optoelectronic package structure 1 from the third surface 11-3 of the carrier 11. In some arrangement, the first power supply path 111 and the second power supply path 112 may be connected to a power voltage or signal or connected to a ground voltage or signal. In some arrangement, the first and second power supply paths 111 and 112 may be connected to a power voltage or signal of a Printed Circuit Board (PCB) for driving a corresponding component (e.g., the electronic component 12 or the processing unit 14). The first power supply path 111 and the second power supply path 112 may be connected to the same external power source or different external power sources. In some arrangements, the electrical signal path 113 is included in or traverse through the first region 11a of the carrier 11. In some arrangements, the electrical signal path 113 may pass through the first region 11a of the carrier 11 to provide electrical communication (e.g., to transmit electrical signals) between the first surface 11-1 and the second surface 11-2 of the carrier 11. The electrical signal path 113 may be configured to provide communication between the processing unit 14 and the electronic component 12. In some arrangements, a length of the electrical signal path 113 is shorter than a length the second power supply path 112.

The carrier 11 may include a first surface 11-1, a second surface 11-2, a third surface 11-3, a fourth surface 11-4, and a fifth surface 11-5. The first surface 11-1 may be referred to as a top surface or an upper surface. The first surface 11-1 and the second/third surfaces 11-2/11-3 are located at two opposite sides of the carrier 11. The second and third surfaces 11-2 and 11-3 may be referred to as lower surfaces or bottom surfaces. In some arrangements, the second surface 11-2 may be viewed as a surface formed after a cavity or recess is formed from the third surface 11-3. The second surfaces 11-2 may be substantially parallel to the third surface 11-3 and the first surface 11-1, in some examples. In some examples, the second surfaces 11-2 may be closer to the first surface 11-1 than the third surface 11-3. Two or more of the first surface 11-1, the second surface 11-2, and the third surface 11-3 are located at different elevations with respect to a reference surface such as a surface of the RDL 141 or of the processing unit 14 facing the carrier 11. In some examples, two or more of the first surface 11-1, the second surface 11-2, the third surface 11-3, and the reference surface are substantially parallel, such that the elevation with respect to any point from each of the two or more of the first surface 11-1, the second surface 11-2, and the third surface 11-3 are located at different elevations or distances with respect to the reference surface. In some arrangements, the second surface 11-2 may be located between the first surface 11-1 and a third surface 11-3 along an axis substantially perpendicular to one or more of the first surface 11-1, the second surface 11-2, the third surface 11-3, and the reference surface. The fourth surface 11-4 connects the second surface 11-2 and the third surface 11-3. The fifth surface 11-5 connects the first surface 11-1 and the second surface 11-2. The fourth surface 11-4 and the fifth surface 11-5 may be referred to as lateral surfaces. Accordingly, the surfaces 11-1, 11-2, 11-3, 11-4, and 115 form a T-shape of the carrier 11 from the cross-sectional view illustrated in FIG. 1.

In some arrangements, the carrier 11 includes or defines at least one cavity 11c (or a cut-away) recessed from the bottom surface (i.e., the surface 11-3) of the carrier 11. In some arrangements, the cavity 11c is configured to accommodate the electronic component 12. As shown in FIG. 1, the carrier 11 defines a cavity 11c on each side of the second region 11b sized and shaped to accommodate the size and shape of the electronic component 12. The cavity 11c is formed due to the differences in elevation between the two or more of the first surface 11-1, the second surface 11-2, and the third surface 11-3. In some arrangements, the cavity 11c is located at or in the first region 11a of the carrier 11, and the second surface 11-2 is at or in the first region 11a of the carrier 11 facing the cavity 11c. In some arrangements, the third surface 11-3 is at or in the second region 11b of the carrier 10. In some arrangements, the second region 11b protrudes from the rest of the carrier 11 (e.g., from the first region 11a) in a direction facing away from processing unit 14. In some arrangements, the cavity 11c is at the peripheral region of the carrier 11. In some arrangements, the carrier 11 may be free from any through vias. In some arrangements, the fourth surface 11-4 and the second surface 11-2 of the carrier 11 collectively and at least partially define a cavity 11c.

In some arrangements, the carrier 11 includes an electrically conductive structure and a dielectric structure (not shown). The electrically conductive structure may include electrically conductive features, such as one or more conductive wiring layers, contact pads (disposed at the first surface 11-1, the second surface 11-2 and/or the third surface 11-3 of the carrier 11), vias electrically connecting the conductive wiring layers and pads, and so on. In some arrangements, the dielectric structure may include one or more dielectric layers. The one or more dielectric layers and the one or more conductive wiring layers are stacked on one another. The power supply paths 111 and 112 and the electrical signal path 113 can be formed by designing the electrically conductive features accordingly in suitable manners. The carrier 11 may be or include a paper-based copper foil laminate, a composite copper foil laminate, a polymer-impregnated glass-fiber-based based copper foil laminate, or so on. The carrier 11 may be or include a substrate such as an organic substrate or a leadframe. The carrier 11 may be or include an interposer, an RDL, a fan-out substrate, or the like.

As shown in FIG. 1, the electronic component 12 includes a first surface (or side) 12-1, a second surface (or side) 12-2, and a third surface (or side) 12-3. The first surface 12-1 may be referred to as a top surface or an upper surface of the electronic component 12. The third surface 12-3 is opposite to the first side 12-1 and may be referred to as a lower surface or a bottom surface of the electronic component 12. The second surface 12-2 connects the first surface 12-1 and the third surface 12-3 and may be referred to as a lateral surface of the electronic component 12. At least a portion of the first surface 12-1 faces the first region 11a of the carrier 11, and at least a portion of the first surface 12-1 faces the photonic component 13. In some arrangements, the third surface 12-3 is substantially coplanar with a bottom surface (the third surface 11-3) of the carrier 11. In other arrangements, the third surface 12-3 is not coplanar with the third surface 11-3 of the carrier 11. In some arrangements, the electronic component 12 is at least partially embedded in the first region 11a of the carrier 11. For example, at least a portion of the electronic component 12 may be disposed in the cavity 11c located at the first region 11a of the carrier 11. The first surface 12-1 of the electronic component 12 may have a portion 12b exposed from (or extends beyond) the cavity 11c (or the surface 11-5) in a direction substantially parallel to the surface 12-3 and/or 11-3. The portion 12b is electrically connected with the photonic component 13. As shown in FIG. 1, the first surface 12-1 of the electronic component 12 may have a portion 12a covered by the carrier 11 (is not explored from or does not extend beyond the cavity 11c (or the surface 11-5) in a direction substantially parallel to the surface 12-3 and/or 11-3) and the portion 12b exposed from the carrier 11. In other words, the portion 11a is embedded within the cavity 11c.

In some arrangements, the electronic component 12 is disposed on or adjacent to the second surface 11-2 of the carrier 11. The first portion 12a may be located on or adjacent to the second surface 11-2 of the carrier 11, and may be electrically connected with the carrier 11 through the RDL 121 and the conductive elements 122a. In some arrangements, the issue of size difference between the conductive traces and pads of the electronic component 12 and the conductive traces and pads of the carrier 11 can be resolved by the RDL 121. The second portion 12b of the electronic component 12 overhangs the first region 11a of the carrier 11. In some arrangements, the underfill 16 may be disposed between the second surface 11-2 of the carrier 11 and the RDL 121 at least partially within the first region 11a, and encapsulates the conductive elements 122a in the first region 12a of the electronic component 12. In some arrangements, a lateral surface (e.g., the surface 12-2) of the electronic component 12 near the carrier 11 may be physically separated from the carrier 11 with a gap therebetween. In some arrangements, a lateral surface (e.g., the surface 12-2) of the electronic component 12 near and facing the carrier 11 may be spaced apart from the fourth surface 11-4 of the carrier 11 by a gap. The gap may provide a buffer or tolerance space for the volume changes of the carrier 11 and/or the electronic component 12 resulted from thermal expansion. Therefore, undesirable separation or breakage between the carrier and the electronic component can be prevented, deformation of the optoelectronic package structure 1 can be prevented, and thus the reliability of the optoelectronic package structure 1 can be improved. In some arrangements, the electronic component 12 includes an EIC component.

As shown in FIG. 1, the photonic components 13 may be at least partially disposed on or adjacent to the electronic component 12 and in proximity to the first region 11a of the carrier 11. Specifically, the photonic component 13 may be at least partially disposed on or adjacent to the second portion 12b of the first surface 12-1 of the electronic component 12 such that a portion of the photonic component 13 overhangs the electronic component 12, which is beneficial in attaching the optical component 15 (such as a laser diode or a fiber array unit (FAU)) on the photonic components by a pick-and-place process. In some arrangements, the photonic component 13 at least partially overlaps with the electronic component 12 from a top view perspective, along or parallel to an axis perpendicular to the surfaces 12-1 and/or 12-3, or a surface of the photonic component 13 facing the electronic component 12. In some arrangements, the photonic component 13 is electrically connected to the electronic component 12 through the RDL 131, the conductive elements 122b, and the RDL 121. In some arrangements, the photonic component 13 is physically separated from the carrier 11. For example, the photonic component 13 is spaced apart from the fifth surface 11-5 of the carrier 11 by a gap therebetween. Similar to discussed above, the presence of the gap may be beneficial to improve reliability of the optoelectronic package structure 1. In some arrangements, the photonic component 13 includes a PIC component. The EIC component and the PIC component in combination may be referred to as a photonics engine or photonics device.

The processing unit 14 may be disposed on or adjacent to the first surface 11-1 of the carrier 11. In some arrangements, at least a portion of the processing unit 14 is disposed over the second region 11b of the carrier 11. In some arrangements, the processing unit 14 covers the second region 11b of the carrier 11 from a top view perspective, along or parallel to an axis perpendicular to one or more of the first surface 11-1, the second surface 11-2, the third surface 11-3, or a surface of the processing unit 14 facing the carrier 11. In some arrangements, the processing unit 14 is electrically connected with first surface 11-1 of the carrier 11 using the RDL 141 and the conductive elements 142. As shown in FIG. 1, the processing unit 14 at least partially overlaps with at least a portion of the electronic component 12 from a top view perspective, along or parallel to an axis perpendicular to one or more of the first surface 11-1, the second surface 11-2, the third surface 11-3, the first surface 12-1, the third surface 12-3, or a surface of the processing unit 14 facing the carrier 11. The processing unit 14 may include a central processing unit (CPU), a microcontroller unit (MCU), a graphics processing unit (GPU), an application-specific integrated circuit (ASIC) (e.g., a switch ASIC), a storage element (e.g., a SRAM), or a combination thereof.

The optical components 15 may be disposed on, embedded in, or adjacent to the photonic component 13, and may be optically coupled to the photonic component 13. In some arrangements, the optical component 15 is optically coupled to a waveguide (not shown) of the photonic component 13. In some arrangements, the optical component 15 is configured to transmit to and/or receive optical signals from the photonic component 13. In some arrangements, as shown in FIG. 1, an edge or corner of the photonic component 13 may define a space or a recess configured (shaped and sized) to accommodate the optical component 15. The optical component 15 may be coupled (e.g., attached or fixed) to the edge or corner of the photonic component 13. In some arrangements, the optical component 15 includes one or more optical fibers or laser diodes. In some arrangements, the optical component 15 includes an FAU. In some arrangements, the optical components 15 may be located at or embedded in an active surface of the photonic component 13. At least a portion of the active surface of the photonic component 13 faces the electronic component 12. In some arrangements, at least a portion of the optical component 15 may be located adjacent to at least a portion of a lateral surface of the photonic component 13 facing away from the carrier 11.

The conductive elements 142 may be between the carrier 11 and the processing unit 14 to provide electrical connection therebetween. In some arrangements, the conductive elements 142 may be in direct contact with the first surface 11-1 of the carrier 11. In some arrangements, the conductive elements 142 include conductive bumps to provide electrical connection the between the carrier 11 and the processing unit 14. The conductive elements 122*b* are disposed between the electronic component 12 and the photonic components 13 to provide electrical connection therebetween. In some arrangements, the underfill 18 may cover or encapsulate the conductive elements 142 between the carrier 11 and the processing unit 14. The conductive elements 122*a* may be between the carrier 11 and the electronic component 12 to provide electrical connection therebetween. The conductive elements 122*b* may be between the electronic component 12 and the photonic component 13 to provide electrical connection therebetween. In some arrangements, the conductive elements 122*a* and 122*b* may include conductive bumps. In some arrangements, the underfill 16 covers or encapsulates the conductive elements 122*a* between the carrier 11 and the electronic component 12. The underfill 17 covers or encapsulates the conductive elements 122*b* between the electronic component 12 and the photonic component 13.

In some arrangements, a pitch of the conductive elements 142 is greater than a pitch of the conductive elements 122*a* or than a pitch of the conductive elements 122*b*. The term "pitch" refers to a center-to-center distance between adjacent conductive elements. In some arrangements, a size (e.g., a diameter or a width) of the conductive elements 142 is greater than a size (e.g., a diameter or a width) of the conductive elements 122*a* or 122*b*.

In some arrangements, electrical contacts (not shown) may be disposed on the third surface 11-3 (i.e., bottom surface) of the carrier 11. The electrical contacts can provide electrical connections between the optoelectronic package structure 1 and external components (e.g., external circuits or circuit boards, not shown). In some arrangements, the electrical contacts include solder balls. In some arrangements, the electrical contacts include a ball grid array (BGA), or a land grid array (LGA).

In some existing optoelectronic package structures, the processing unit (e.g., the ASIC), the carrier, and the photonics engine (specifically, the EIC component of the photonics engine) are disposed in a vertical or 3-dimensional arrangement, with the processing unit and the photonics engine are disposed on two opposite sides of the carrier and electrically connected with each other through the carrier. To provide such electrical connection, through vias, which penetrate through the carrier from one side to the opposite side, are required to be formed. Due to the thickness of the carrier, the through vias are required to be formed with a high aspect ratio. The electrical path between the processing unit and the photonic engine may be relatively long, which hinders high-speed transmission. The transmitted signals may be distorted. In addition, the size or thickness of the package structure is usually relatively large.

In the optoelectronic package structures according to the present disclosure, given that the electronic component 12 is embedded in the carrier 11 (disposed in the cavity 11*c* of the carrier 11), the thickness of the carrier 11 between the processing unit 14 and the electronic component 12 long an axis perpendicular to one or more surfaces 11-1, 11-3, 12-1, 12-3, or a surface of the processing unit 14 facing the electronic component 12 can be reduced. Therefore, the electrical path 113 between the processing unit 14 (e.g., ASIC) and the electronic component 12 (e.g., EIC) can be reduced. Since the thickness of the carrier 11 between the processing unit 14 and the electronic component 12 is reduced, through vias with high aspect ratio are not needed. Furthermore, because the electronic component 12 is embedded in the carrier 11 (disposed in the cavity 11*c* of the carrier 11), the size, dimension or thickness of the optoelectronic package structure 1 can be reduced.

Figure 2A:
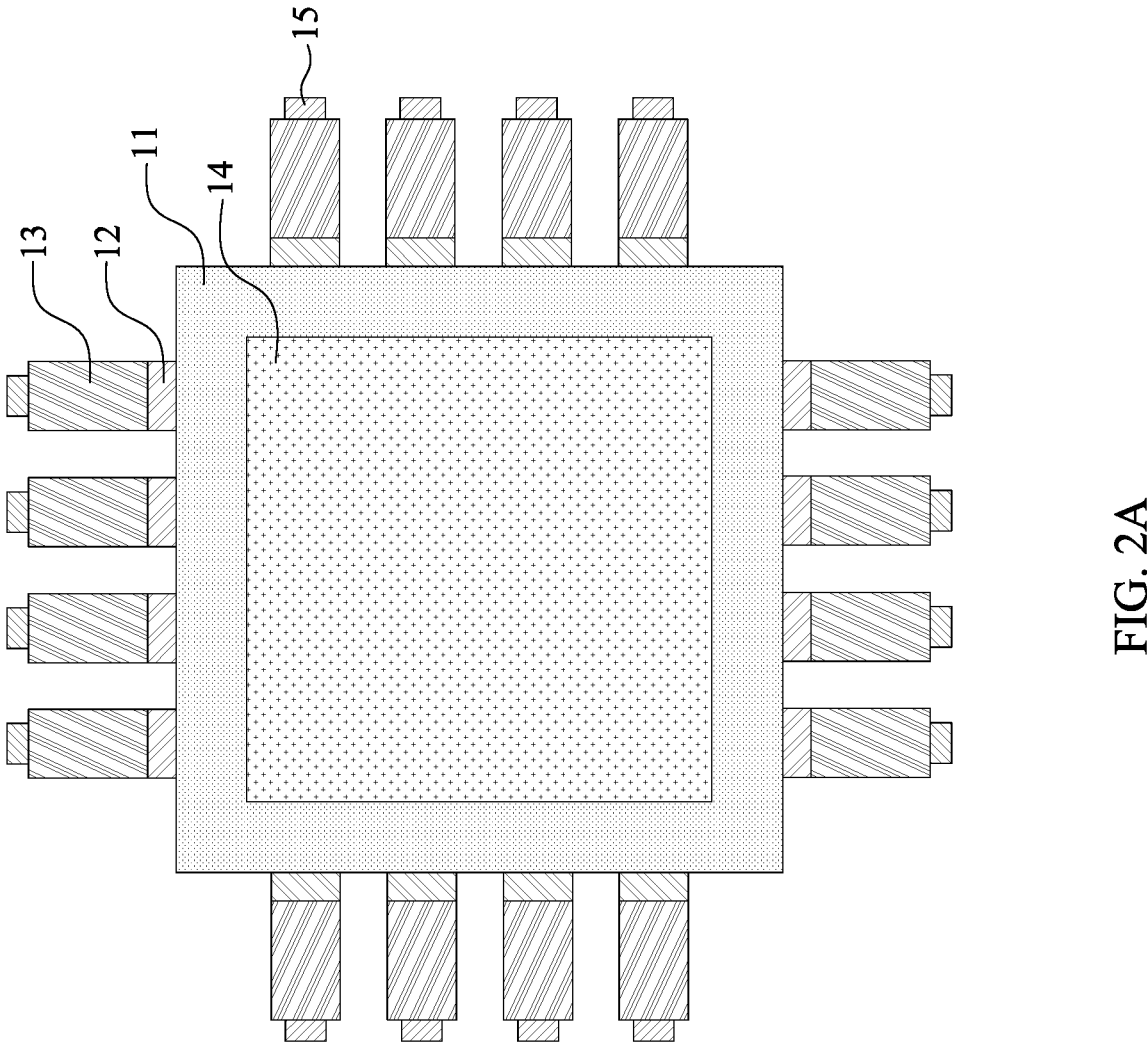
FIG. 2A illustrates a schematic top view of a portion of an optoelectronic package structure in accordance with some arrangements of the present disclosure.
Figure 2A:

FIG. 2A illustrates a top view of an optoelectronic package structure 1 in accordance with some arrangements of the present disclosure. FIG. 2A illustrates a top view of the arrangement of the processing unit 14, the carrier 11, the electronic component 12, the photonic component 13, and the optical component 15. It should be noted that some components or elements are omitted in FIG. 2A for clarity or not shown in view. As shown in FIG. 1 with reference to FIG. 2A, each electronic component 12 is at least partially covered by the photonic component 13 from the top view perspective. In some arrangements, the photonic component 13 least partially overlaps with a portion of the electronic components 12 from the top view perspective. In some arrangements, at least a portion the optical components 15 are at least partially covered by the photonic components 13 from the top view perspective. In some arrangements, at least a portion of each electronic component 12 is at least partially covered by the carrier 11 from the top view perspective. In some arrangements, the carrier 11 are at least partially covered by the processing unit 14 from a top view perspective.

Figure 2B:
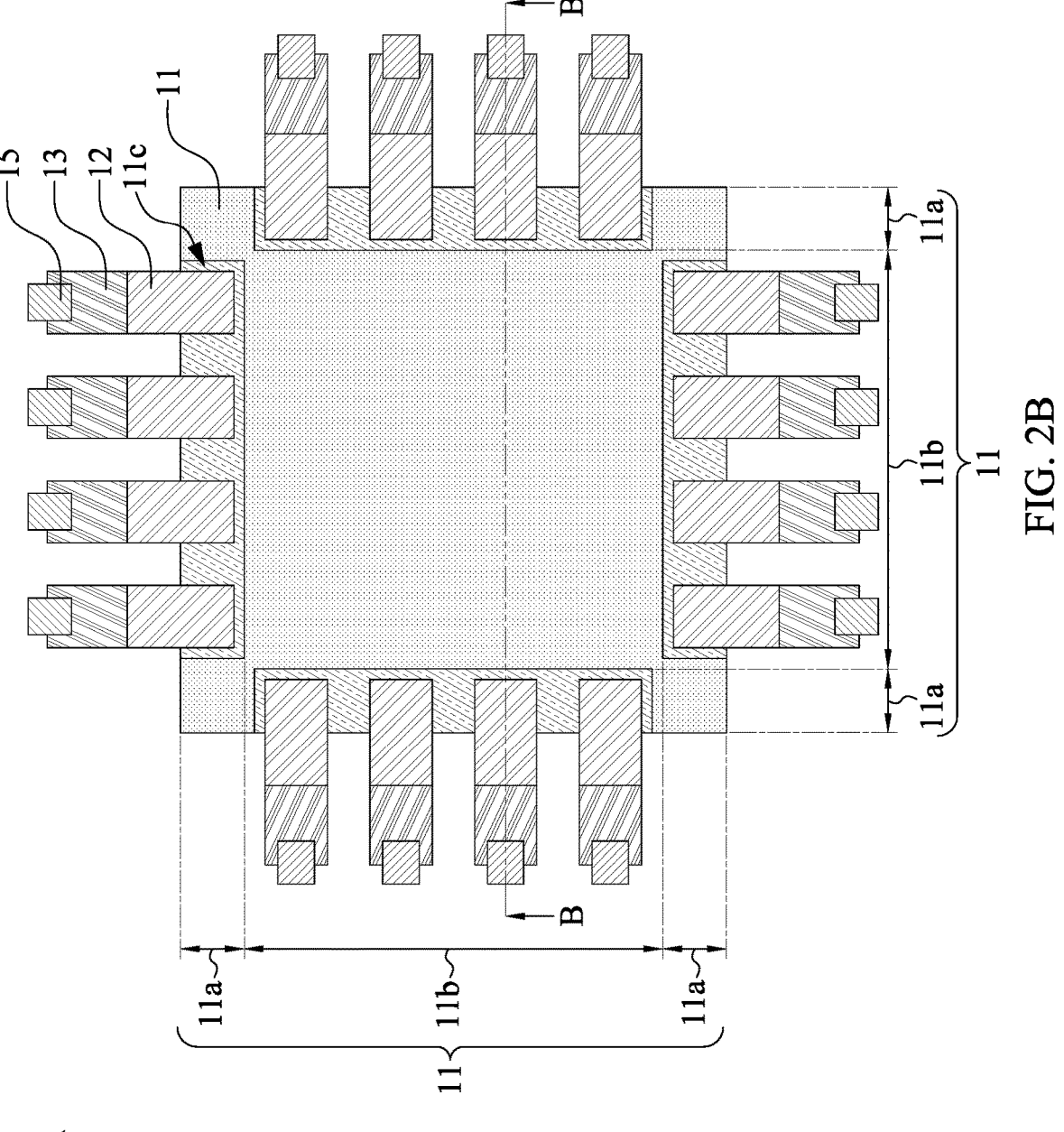
FIG. 2B illustrates a schematic bottom view of a portion of an optoelectronic package structure in accordance with some arrangements of the present disclosure.

FIG. 2B illustrates a bottom view of an optoelectronic package structure 1 in accordance with some arrangements of the present disclosure. In some arrangements, FIG. 1 illustrates a cross-sectional view along the cross-sectional line B-B' in FIG. 2B. It should be noted that some components are omitted in FIG. 2B for clarity or not shown in view. In some arrangements, the electronic components 12 and the photonic components 13 are disposed under or adjacent to a peripheral region (e.g., the first region 11*a*) of the carrier 11. In some arrangements, the electronic components 12 and the photonic components 13 surround a central region 11*b* (i.e., the second region 11*b*) of the carrier 11. The peripheral region 11*a* of the processing unit 20 surrounds the central region 11*b*. As shown in FIG. 2B, the cavities 11*c* are located at the peripheral region 11*a* of the carrier 11. As shown in FIG. 2B, in some arrangements, each cavity 11*c* accommodates a plurality of electronic components 12, and the electronic components 12 may be spaced apart from each other within the same cavity 11*c*.

Figure 2C:
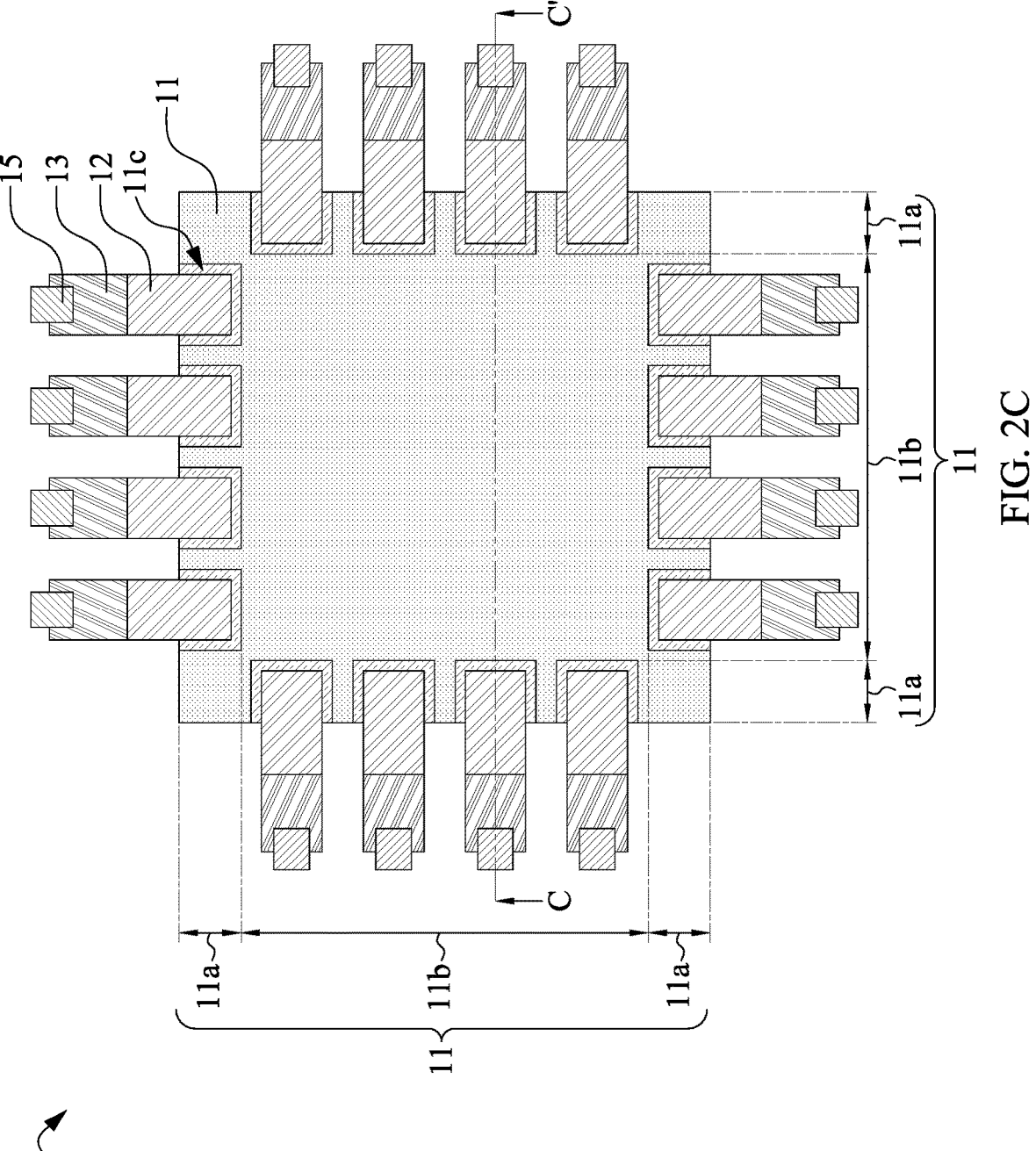
FIG. 2C illustrates a schematic bottom view of a portion of an optoelectronic package structure in accordance with some arrangements of the present disclosure.

FIG. 2C illustrates a bottom view of an optoelectronic package structure 1 in accordance with some other arrangements of the present disclosure. In such arrangements, FIG. 1 illustrates a cross-sectional view along the cross-sectional line C-C' in FIG. 2C. It should be noted that some components are omitted in FIG. 2C for clarity or not shown in view. The structure illustrated in FIG. 2C is similar to the structure illustrated in FIG. 2B, except that in FIG. 2C, each of the electronic components 12 are disposed in a respective one of the cavities 11*c*.

Figure 3A:
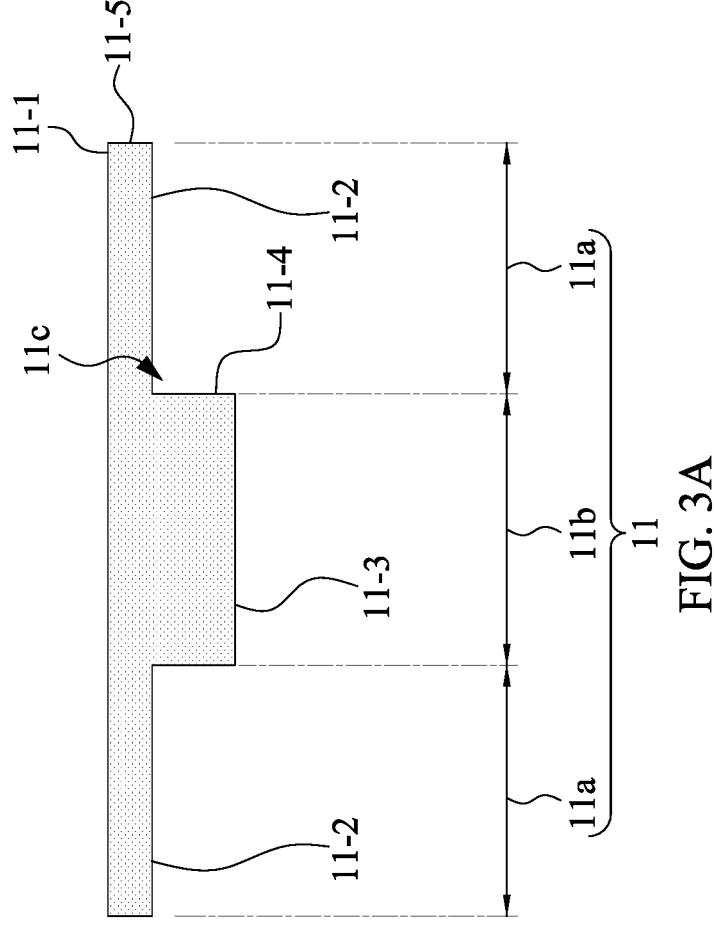
FIG. 3A.

FIG. 3A to FIG. 3E illustrate various operations in a method of manufacturing an optoelectronic package structure 1 in accordance with some arrangements of the present disclosure. Referring to FIG. 3A, a carrier 11 including a first region 11*a* and a second region 11*b* may be provided. The carrier 11 includes a first side (e.g., the first surface 11-1), a second side (e.g., the second surface 11-2), a third side (e.g., the third surface 11-3), a fourth side (e.g., the fourth surface 11-4), and a fifth side (e.g., a fifth surface 11-5). The carrier 11 defines at least one cavity 11*c*. In some arrangements, the cavity 11*c* can be formed by removing at least a portion of the carrier 11 to form the surfaces 11-2 and 11-4.

Figure 3B:
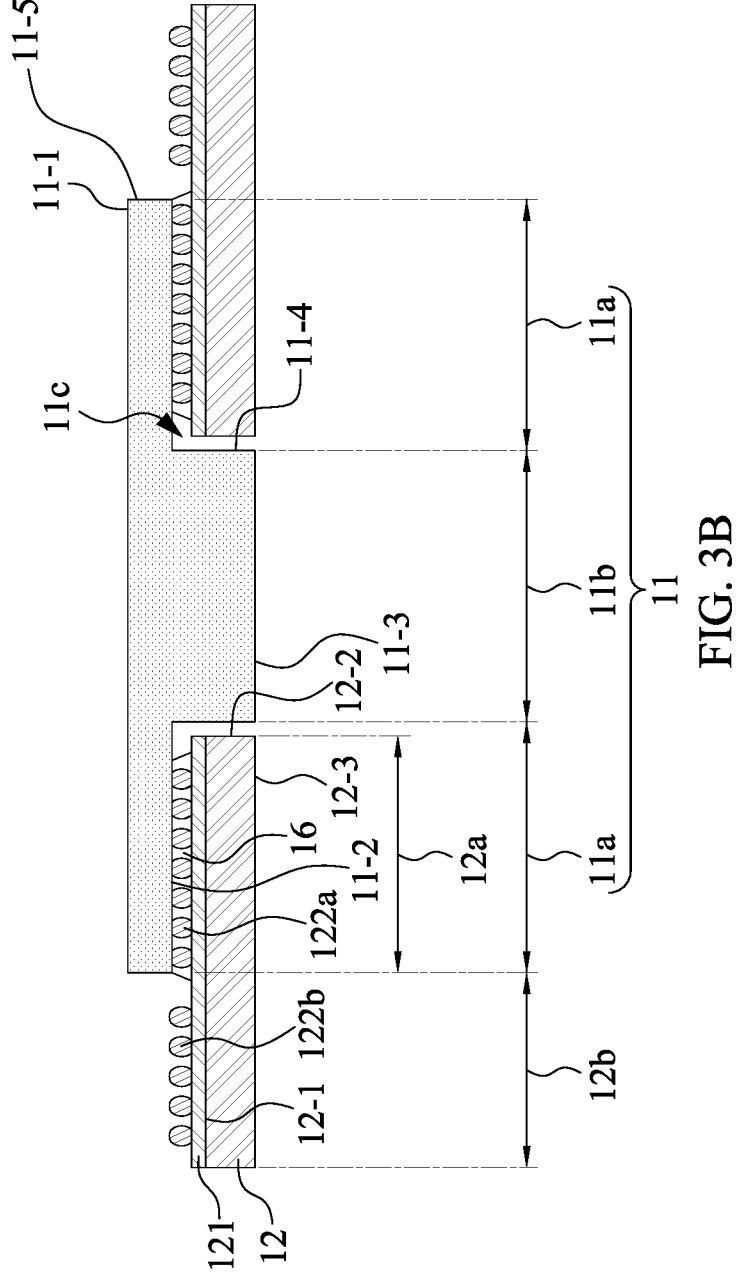
FIG. 3B, FIG. 3C, FIG. 3D and FIG. 3E each illustrates a schematic cross-sectional view of a structure at a fabrication stage involved in a method for manufacturing an optoelectronic package structure in accordance with some arrangements of the present disclosure.

Referring to FIG. 3B, an electronic component 12 is provided and an RDL 121 and conductive elements 122*a* and 122*b* are formed on a surface 12-1 of the electronic component 12. Specifically, the conductive elements 122*a* and 122*b* are formed on a portion 12*a* of the surface 12-1 and a portion 12*b* of the surface 12-1, respectively. The electronic component 12 is disposed in the cavity 11*c* of the carrier 11 and electrically connected with the first region 11*a* of the carrier 11 through the RDL 121 and the conductive elements 122*a*. In some arrangements, an underfill material 16 may be disposed between the RDL 121 and the carrier 11, encapsulating the conductive elements 122*a*.

Figure 3C:
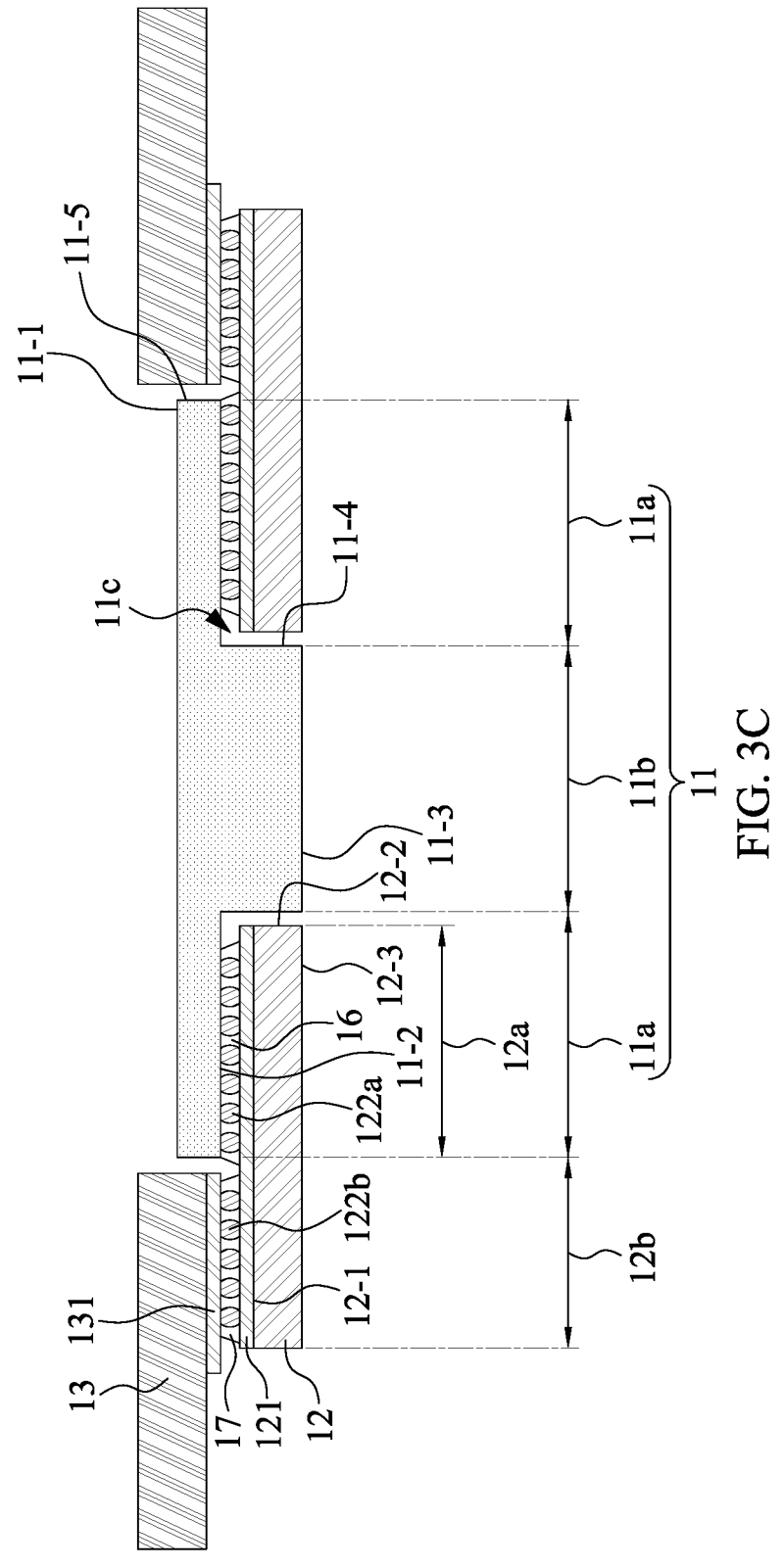

Referring to FIG. 3C, a photonic component 13 is provided and an RDL 131 may be formed on a surface of the photonic component 13. In some arrangements, the photonic component 13 is disposed on the second portion 12*b* of the electronic component 12 and electrically connected with the electronic component 12 through the RDL 131, the conductive elements 122*b* and the RDL 121. In some arrangements, an underfill 17 may be disposed between the RDL 121 and the RDL 131 encapsulating the conductive elements 122*b*. The photonic component 13 has a portion overhanging the electronic component 12.

Figure 3D:
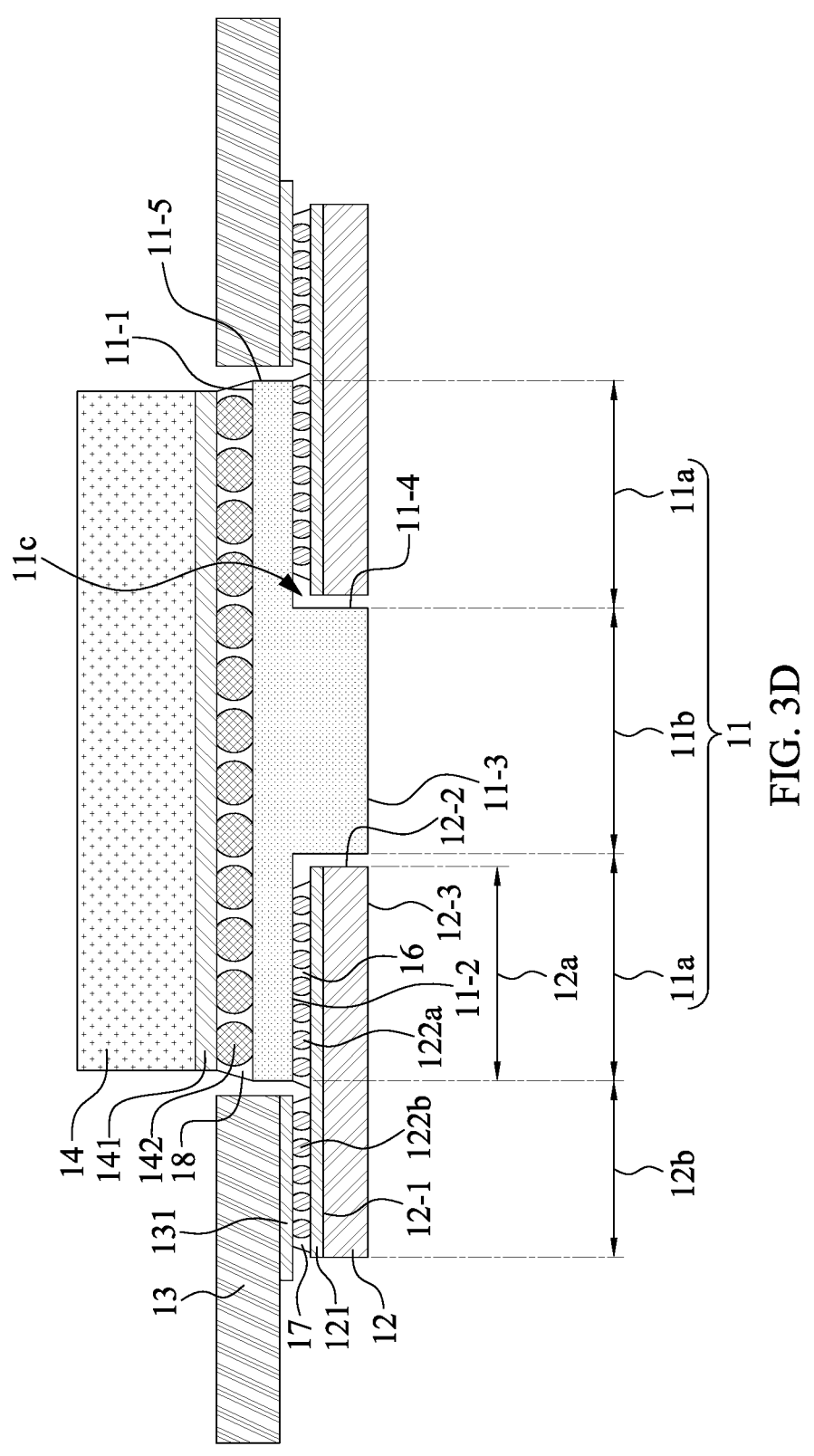

Referring to FIG. 3D, a processing unit 14 is provided and an RDL 141 and the conductive elements 142 may be formed on a surface of the processing unit 14. The processing unit 14 is disposed on the first surface 11-1 (e.g., the upper surface) of the carrier 11 and electrically connected with the carrier 11 through the RDL 141 and the conductive elements 142. In some arrangements, the underfill material 18 may be disposed between the carrier 11 and the RDL 141, encapsulating the conductive elements 142.

Figure 3E:
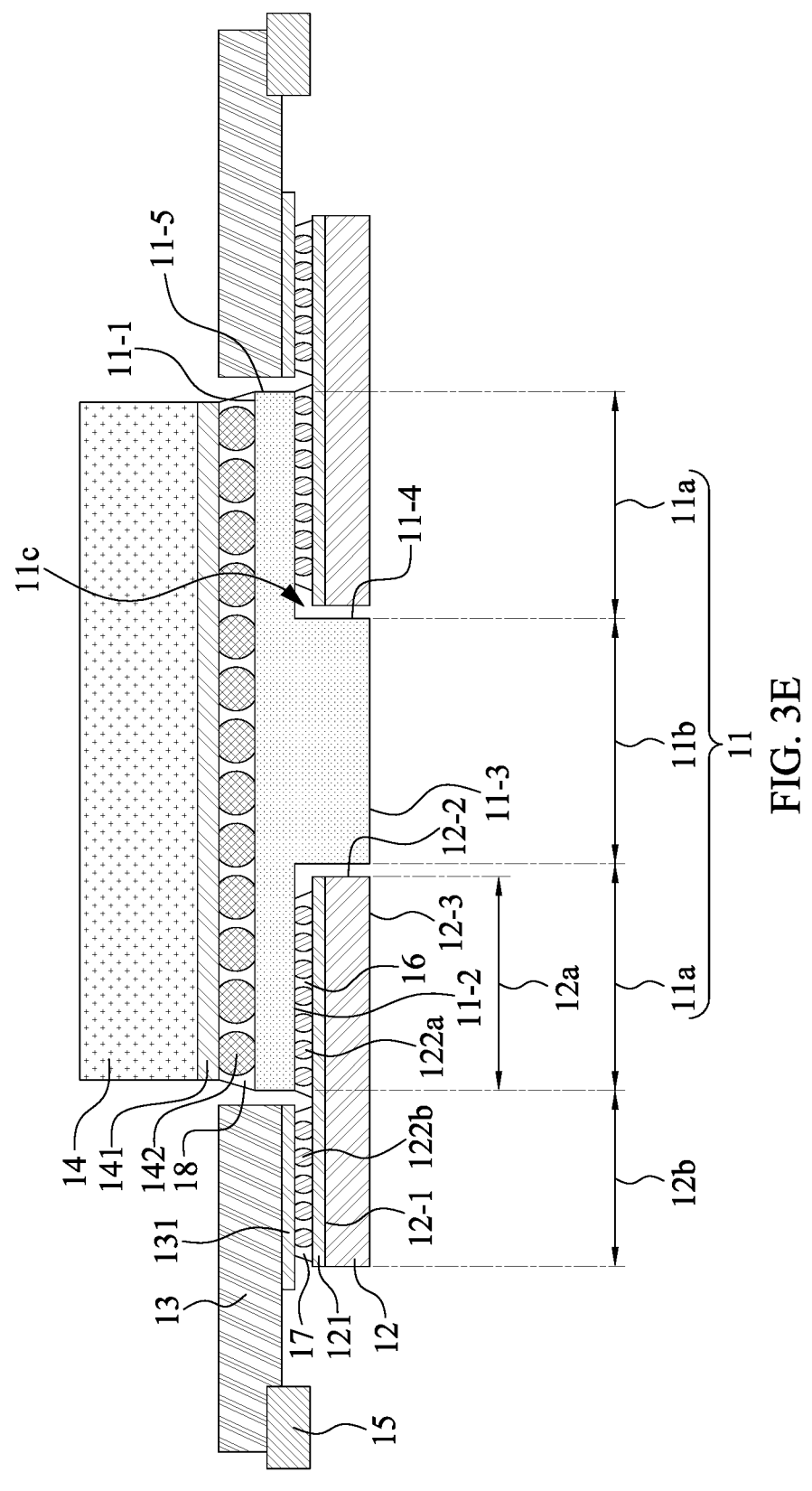

Referring to FIG. 3E, an optical component 15 may be disposed on the overhanging portion of the photonic component 13, for example, by a pick-and-place process. In some other arrangements, the optical component 15 may be disposed on the overhanging portion of the photonic component 13 before or after the disposal of the photonic component 13 on the electronic component 12 (e.g., the operation illustrated in FIG. 3C).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the arrangements of this disclosure are not deviated from by such an arrangement.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise.

In the description of some arrangements, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optoelectronic package structure, comprising:

a carrier;

a photonic component laterally adjacent to the carrier;

an electronic component connected to the photonic component and the carrier;

a circuit layer disposed between and electrically connected to the photonic component and the electronic component; and a processing unit disposed over the circuit layer and electrically connected to the electronic component through the circuit layer.

2. The optoelectronic package structure of claim 1, wherein the photonic component has a side facing the electronic component, and the side is configured to be connected to an optical component.

3. The optoelectronic package structure of claim 1, wherein the photonic component overhangs the electronic component.

4. The optoelectronic package structure of claim 1, wherein the electronic component overhangs the carrier.

* * * * *